(12) United States Patent
Björmander et al.

(10) Patent No.: US 7,597,951 B2
(45) Date of Patent: Oct. 6, 2009

(54) COATED CUTTING TOOL INSERT

(75) Inventors: Carl Björmander, Spånga (SE);
Markus Rodmar, Vallentuna (SE)

(73) Assignee: Sandvik Intellectual Property AB, Sandviken (SE)

( * ) Notice: Subject to any disclaimer, the term of this patent is extended or adjusted under 35 U.S.C. 154(b) by 575 days.

(21) Appl. No.: 11/378,614

(22) Filed: Mar. 20, 2006

(65) Prior Publication Data

US 2006/0222894 A1    Oct. 5, 2006

(30) Foreign Application Priority Data

Mar. 23, 2005  (SE) .................................. 0500648

(51) Int. Cl.
*B32B 9/00* (2006.01)
*C23C 16/40* (2006.01)

(52) U.S. Cl. .................... 428/216; 51/307; 51/309; 427/255.11; 427/255.23; 427/255.28; 427/255.29; 427/255.31; 427/255.32; 427/255.36; 427/255.391; 427/419.1; 427/419.2; 427/419.3; 428/336; 428/698; 428/701; 428/702

(58) Field of Classification Search ............... 51/307, 51/309; 428/216, 336, 698, 701, 702; 427/255.11, 427/255.23, 255.28, 255.29, 255.31, 255.32, 427/255.36, 391, 419.1, 419.2, 419.3
See application file for complete search history.

(56) References Cited

U.S. PATENT DOCUMENTS

| 4,746,563 | A | | 5/1988 | Nakano et al. |
|---|---|---|---|---|
| 4,749,629 | A | | 6/1988 | Sarin et al. |
| 4,844,951 | A | | 7/1989 | Sarin et al. |
| 5,700,551 | A | * | 12/1997 | Kukino et al. ............... 428/701 |
| 5,827,570 | A | | 10/1998 | Russell |
| 6,077,596 | A | * | 6/2000 | Hashimoto et al. .......... 428/216 |
| 2001/0016273 | A1 | | 8/2001 | Narasimhan et al. |

FOREIGN PATENT DOCUMENTS

| EP | 0 603 144 | 6/1994 |
|---|---|---|
| EP | 0 693 574 | 1/1996 |
| EP | 0 701 982 | 3/1996 |
| EP | 0 885 984 | 12/1998 |
| EP | 0 878 563 | 10/2001 |
| GB | 2 048 960 | 12/1980 |
| GB | 2 182 060 | 5/1987 |
| JP | 61-270374 | 11/1986 |

OTHER PUBLICATIONS

Mårtensson, "Influence of the concentration of $ZrCl_4$ on texture, morphology and growth rate of CVD grown $\alpha$-$Al_2O_3$ coatings deposited by the $AlCl_3$/$ZrCl_4$/$H_2$/$CO_2$/$H_2S$ process," Surface and Coatings Technology, Elsevier, vol. 200, No. 11, Mar. 15, 2006, pp. 3626-3632.

S. Ruppi et al., "Microstructure and deposition characteristics of $\kappa$-$Al_2O_3$," J. Phys. IV France 9 (1999), Pr8-349 through 8-355.

* cited by examiner

*Primary Examiner*—Archene Turner
(74) *Attorney, Agent, or Firm*—Drinker Biddle & Reath LLP

(57) ABSTRACT

The present invention relates to a metal cutting tool insert with a coating comprising a metal oxide multilayer, which exhibits especially high resistance to plastic deformation as well as excellent resistance to flank and crater wear and high resistance to flaking, particular when used for machining of low carbon steel and stainless steel. The invention also relates to a method of making such a cutting tool insert.

20 Claims, 1 Drawing Sheet

COATED CUTTING TOOL INSERT

BACKGROUND OF THE INVENTION

The present invention relates to a cutting tool insert coated with a metal oxide multilayer with improved resistance to flaking and to plastic deformation, particularly suitable for machining of steel by turning, milling, drilling or by similar chip forming machining methods, and a method of making the same.

When cemented carbide cutting tool inserts are used in the machining of metals, the insert is worn by different mechanisms such as abrasive and chemical wear, chipping and fracturing of the cutting edge. Some metals are more difficult to machine than others since, in addition to the above mentioned wear mechanisms, also adhesive wear and resulting flaking of coatings, can occur. Examples of such metals are stainless steel and low carbon steel. Adhesive wear results when smearing materials during the cutting operation continuously adhere to and tear off material from the cutting edge, which shortens tool insert life. Furthermore, when cutting at high cutting speeds, the thermal energy transferred to the cutting edge is considerable and the insert edge may partly or entirely deform plastically. This mode of deterioration of the cutting edge is known as plastic deformation wear.

Multilayer coatings comprising first and second layers of different materials which are alternately laminated on the substrate, each of the first coating layers having a first thickness and each of the second coating layers having a second thickness are known in the art. The two layers should preferably have a different crystal structure and/or at least different lattice spacings. One example of such a structure is when an $Al_2O_3$ growth periodically is interrupted by a short TiN deposition process resulting in a $(Al_2O_3+TiN)_x$ multilayer structure see e.g. Proceedings of the 12:th European CVD Conference page pr. 8-349. GB 2048960A discloses a multilayer coating with a multiplicity of alternating layers of 0.02 to 0.1 μm consisting of hard material of different compositions.

U.S. Pat. No. 5,827,570 discloses a cemented carbide or ceramic substrate with a wear resistant composite ceramic coating comprising a doped two-phase metal oxide layer comprising a continuous metal oxide phase, comprising aluminum oxide, yttrium oxide or zirconium oxide, and a discontinuous metal oxide phase, comprising a dispersed, discrete second phase of aluminum oxide, yttrium oxide or zirconium oxide.

In U.S. Pat. No. 4,749,629 the integration of $ZrO_2$ is done by using a laminated oxide coating, with a total thickness of 0.3-20 μm, consisting of alternating different oxide layers such as $Al_2O_3$, $ZrO_2$ and $Y_2O_3$ and where each oxide layer has a thickness within 0.1-3 μm.

Requirements for high surface finish of the machined component only allow inserts with a clean, smooth edge line with very little developed wear to be used. It is becoming more and more difficult for the machine operator by a naked eye to differentiate between a little used and an unused cutting edge ("used edge identification"). This is particularly difficult if the top layer is $Al_2O_3$, making the top layer appear dark gray or black. By mistake, using a used insert edge, e.g., during an unmanned night shift run, may cause component rejection or even unwanted production stops. Edge identification can more easily be done if the insert has a top layer of $TiC_xN_yO_z$ or in particular if the top layer is a goldish color TiN-layer.

EP-B-693574 discloses a cutting tool insert having an outermost $Al_2O_3$ layer on the rake face and cutting edge line, because of its ability to withstand diffusion type wear. The clearance face has an outermost $MeC_xN_yO_z$ type layer, where Me is a metal selected from the group consisting of metals in the groups IVB, VB, VIB of the periodic table (further on denoted $TiC_xN_yO_z$), because of its high resistance to flank wear and the possibility for "used edge identification". This is obtained by mechanically removing the $TiC_xN_yO_z$ layer either from only the edge line or from both the rake face and the edge line.

OBJECTS AND SUMMARY OF THE INVENTION

It is the object of the present invention to obtain improvements of the tool insert with respect to the following properties:

Resistance to plastic deformation of the cemented carbide at the cutting edge.

Resistance to a diffusion type crater wear.

Improved flaking resistance and reduced amount of comb cracks in milling.

Addition of a color of tool inserts which enables grade differentiation with respect to color.

In accordance with the invention, there is provided a cutting tool insert having an upper face and at least one clearance face intersecting said upper face to define cutting edges made of cemented carbide, titanium based carbonitride or ceramics, said insert being coated with a hard coating comprising a laminar, multilayered structure MX+NX+MX+NX ..., the alternating MX and NX layers comprising metal oxides, the metal elements M and N chosen from aluminum, zirconium, titanium, hafnium and chromium wherein the repeat period of said multilayer is from about 20 nm or greater but less than 200 nm.

In accordance with the invention, there is also provided a method of making a cutting tool insert wherein said method comprises coating a substrate made of cemented carbide, titanium based carbonitride or ceramics having an upper face and at least one clearance face intersecting said upper face to define cutting edges with a hard coating comprising a laminar, multilayered structure MX+NX+MX+NX ..., the alternating MX and NX layers comprising metal oxides, the metal elements M and N chosen from aluminum, zirconium, titanium, hafnium and chromium, the repeat period of said multilayer being greater than or equal to about 20 nm but less than about 200 nm, by CVD technique comprising holding the substrate to be coated at a temperature of from about 950 to about 1050° C. and contacting said substrate with a hydrogen carrier gas containing one or more metals halides and a hydrolyzing and/or an oxidizing agent and keeping the oxidation potential of the CVD reactor atmosphere prior to nucleation of the metal oxides at a low level with a concentration of water vapor, $H_2O$, or other oxidizing species below about 5 ppm.

BRIEF DESCRIPTION OF THE FIGURE

FIG. 1 shows in 30000× a Scanning Electron Microscope (SEM) micrograph of an exemplary multilayer according to the invention, in which:

Figure 1:
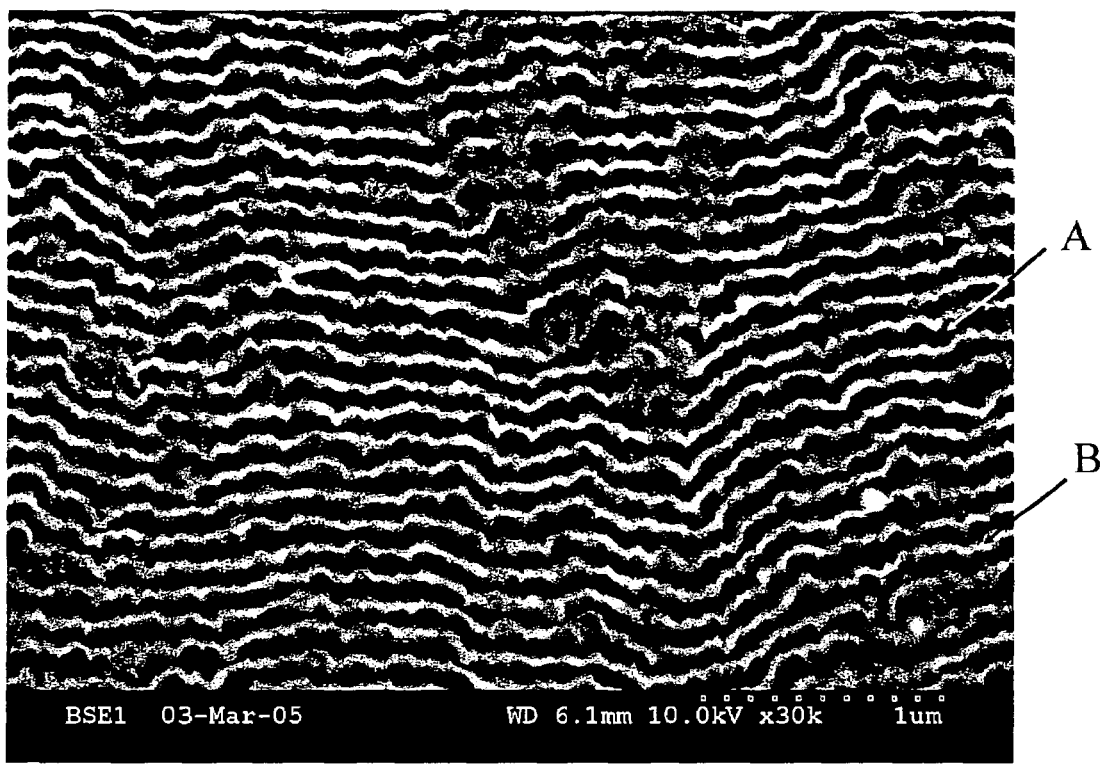

| | |
|---|---|
| —$Al_2O_3$ | A |
| —$ZrO_2$. | B |

DETAILED DESCRIPTION OF THE PREFERRED EMBODIMENTS

It has surprisingly been found that a cutting tool insert with a coating with a plurality of less than 100 nm thick $ZrO_2$ and Al$_2$O$_3$ layers meet all these objectives. Unexpectedly, no thermal cracks are found in the multilayer coatings or in underlying Ti(C,N) layer whereas in Ti(C,N)+α-Al$_2$O$_3$ coatings thermal cracks are normally present. It has also been found that the insert having the multilayer coating according to the invention, has a uniform blue color, which is independent of angle of observation.

According to the present invention, there now exists a cutting tool insert comprising a substrate of generally polygonal or round shape having an upper face, an opposite face and at least one clearance face intersecting said upper and lower faces to define cutting edges, made of cemented carbide, titanium based carbonitride or ceramics, onto which a multilayered coating has been deposited. Said substrate may also be pre-coated with a thin layer of at least one of TiN, TiC, TiC$_x$N$_y$, where x+y=1, x>0 and y>0, or TiAlN with a thickness in the micrometer range according to the prior art. The coated cutting tool insert according the present invention exhibits improved wear resistance and toughness properties compared to prior art tool inserts when used for machining steel or cast iron and, in particular, stainless steel. Said coating, which is adherently bonded to the substrate, comprises a from about 0.1 to about 20 μm, preferably from about 0.1 to about 12 μm, thick laminar, multilayered structure MX+NX+MX+NX.... The alternating MX and NX layers comprise metal oxides, with the metal elements M and N chosen from aluminum, zirconium, titanium, hafnium and chromium, preferably aluminum, zirconium and titanium. The MX and NX layers have a preferred average grain size of from about 10 to about 150 nm, most preferably from about 20 to about 150 nm, and a thickness of from about 10 to about less than 100 nm, preferably from about 10 to about 90 nm. The layer thickness is determined as an average of at least ten random MX and NX layer measurements in a scanning electron microscope structure micrograph. The average grain size may exceed the average layer thickness. In such cases grains are larger in a direction parallel to the substrate surface than in a direction perpendicular to the substrate surface. The repeat period has a thickness from greater than or equal to about 20 nm but less than about 200 nm, preferably less than about 190 nm, most preferably less than about 175 nm. By "repeat period" is meant the thickness of two adjacent layers with different metal elements. The total coating thickness should be greater than about 2 μm, preferably greater than about 5 μm, most preferably greater than about 7 μm, but should be less than about 50 μm, preferably less than about 15 μm, most preferably less than about 10 μm.

Preferably, said multilayer has a blue color defined by the color coordinates, in a CIE standard color chart, being: x=0.2±0.1; y=0.2±0.1.

In one embodiment, the repeat period is essentially constant throughout the entire multilayer structure.

In another embodiment, the sequence of individual MX and NX layers have thicknesses that are aperiodic essentially throughout the entire multilayer structure. The individual layer thicknesses are as defined above. The thickness of one individual layer does not depend on the thickness of an individual layer immediately beneath, nor does it bear any relation to an individual layer above said one individual layer. Thus, for the aperiodic coating structure there is no repeat period by which is meant the thickness after which the structure repeats itself.

In one embodiment, MX is α-Al$_2$O$_3$ and NX is TiO$_z$ where 1.2≦z≦2, preferably 1.5≦z≦2. Preferably the thickness of the Al$_2$O$_3$ layer is≧the thickness of the TiO$_z$ layer, more preferably the Al$_2$O$_3$ layer thickness is from about 1.2 to about 1.5 times the TiO$_z$ layer thickness, most preferably the Al$_2$O$_3$ layer thickness is about 1.4 times the TiO$_z$ layer thickness.

In one embodiment, MX is α-Al$_2$O$_3$ and NX is ZrO$_2$ which has an essentially pure tetragonal structure with less than from about 10 vol-% of monoclinic ZrO$_2$ as determined by XRD. Preferably, the thickness of the Al$_2$O$_3$ layer is≧the thickness of the ZrO$_2$ layer, more preferably the Al$_2$O$_3$ layer thickness is from about 1.1 to about 1.4 times the ZrO$_2$ layer thickness, most preferably the Al$_2$O$_3$ layer thickness is about 1.2 times the ZrO$_2$ layer thickness.

In one embodiment, MX is α-Al$_2$O$_3$ and NX is ZrO$_2$ which has a mixed monoclinic and tetragonal structure having about 40 to about 60 vol-% of monoclinic ZrO$_2$ as determined by XRD. Preferably the thickness of the Al$_2$O$_3$ layer is≧the thickness of the ZrO$_2$ layer, more preferably the Al$_2$O$_3$ layer thickness is from about 1.1 to about 1.4 times the ZrO$_2$ layer thickness, most preferably the Al$_2$O$_3$ layer thickness is about 1.2 times the ZrO$_2$ layer thickness.

In one embodiment, the α-Al$_2$O$_3$ has a texture in the (300) direction with a texture coefficient TC(hkl)>1.5, preferably >3, TC(hkl) being defined as $$TC(hkl) = \frac{I(hkl)}{I_o(hkl)} \left\{ \frac{1}{n} \sum \frac{I(hkl)}{I_o(hkl)} \right\}^{-1}$$

where
I(hkl)=intensity of the (hkl) reflection
I$_o$(hkl)=standard intensity according to PDF card no 10-173
n=number of reflections used in the calculation
(hkl) reflections used are: (012), (104), (110), (113), (024), (116), (124), (030).

In another embodiment, the α-Al$_2$O$_3$ has a texture in the (104) direction with a texture coefficient TC(hkl)>1.5, preferably >2, using the above definition for TC(hkl).

In one embodiment, the multilayer is the outermost layer of the coating.

In another embodiment, the multilayer is the outermost layer of the coating along the cutting edge-line or both the cutting edge-line and the rake face. On the clearance side, the outermost layer is preferably a layer of TiC$_x$N$_y$O$_z$, where x+y+z=1, x≧0, y≧0 and z≧0, or ZrC$_x$N$_y$, where x+y=1, x≧0 and y≧0, most preferably a layer of at least one of TiN, ZrN, TiC$_x$N$_y$, where x+y=1, x>0 and y>0, and TiC.

In yet another embodiment, the multilayer is applied on an Al$_2$O$_3$ layer with a thickness of from about 0.5 to about 40 μm.

The invention also relates to a method of making an insert according to above comprising coating a substrate of cemented carbide, titanium based carbonitride or ceramics with at least one refractory multilayer, deposited either directly on the substrate or on another refractory oxide, carbide and/or nitride layers as known in the art such as for example alumina, titanium carbide, titanium carbonitride, etc., which has already been deposited on the substrate. Said multilayer comprises alternating different metal oxide layers with the metal element chosen from aluminum, zirconium, titanium, hafnium and chromium, preferably aluminum, zirconium and titanium, which are deposited by CVD (Chemical Vapor Deposition) technique, where the substrates to be coated are held at a temperature from about 950 to about 1050° C. and are contacted with a hydrogen carrier gas containing one or more metal halides and a hydrolyzing and/or an oxidizing agent. A sulphur catalyst might also be added to this gas mixture in order to obtain an enhanced deposition rate.

The oxidation potential of the CVD reactor atmosphere prior to the nucleation of the above mentioned metal oxides is kept at a low level with a concentration of water vapor ($H_2O$) or other oxidizing species such as $CO_2$, $O_2$, etc., below about 5 ppm.

The multilayer may be provided with an outer refractory layer as known in the art such as for example titanium carbide, titanium nitride, etc.

The multilayer is characterized by a period containing two different metal oxides.

In one embodiment, the period is started with the nucleation of one metal oxide by sequencing of the reactant gases such that HCl and $CO_2$ are entering the reactor first in an Ar and/or $H_2$ atmosphere followed by the corresponding metal halide. When nucleation of the metal oxide has occurred, a sulphur catalyst, preferably $H_2S$, may be added to the reaction gas mixture in order to obtain an enhanced deposition rate. After this the supply of the metal halide is stopped to ensure the reactor is empty of metal halide. The above mentioned sequence is then repeated for the other metal oxide thus yielding one period of the multilayer where, in the transition of the deposition of the two metal oxides, no mixing of corresponding metal halides takes place.

In a second embodiment, the process is such that throughout the period the reactor contains an Ar and/or $H_2$ atmosphere with reactant gases HCl, $CO_2$ and a sulphur catalyst, preferably $H_2S$ being present and in addition to this the two different metal halides are alternately entering the reactor allowing nucleation and growth of corresponding metal oxide layer. Thus, in at least the transition of the deposition of the two different metal oxides, mixing of the corresponding metal halides takes place.

In an exemplary embodiment, the metal halides are $AlCl_3$ and $ZrCl_4$ and the process is such that, in the transition of the deposition of the two metal oxide layers, mixing of the corresponding halides takes place. The alternating metal oxide layers that are deposited are $\alpha$-$Al_2O_3$ and $ZrO_2$, with the $ZrO_2$ having an essentially tetragonal structure.

In another exemplary embodiment, the metal halides are $AlCl_3$ and $ZrCl_4$ and the process is such that, in the transition of the deposition of the two metal oxide layers, no mixing of the corresponding halides takes place. The alternating metal oxide layers that are deposited are $\alpha$-$Al_2O_3$ and $ZrO_2$, with the $ZrO_2$ having a mixed tetragonal and monoclinic structure.

In another exemplary embodiment, the metal halides are $AlCl_3$ and $TiCl_4$ and deposited metal oxide layers are $\alpha$-$Al_2O_3$ and $TiO_z$, where $1.2 \leq z \leq 2$.

In one embodiment, the coating may also be subject to post-treatment such as brushing, polishing or blasting, partly or fully removing the outermost layer on the cutting edge line or on the both the edge-line and the cutting insert rake face.

The invention is additionally illustrated in connection with the following examples, which are to be considered as illustrative of the present invention. It should be understood, however, that the invention is not limited to the specific details of the examples.

EXAMPLE 1

Invention

Cemented carbide cutting inserts CNMG 120408-PM with the substrate composition 7.5 wt-% Co, 5.3 wt-% cubic carbides (TiC+TaC+NbC) and balance WC, having a surface zone depleted from cubic carbides of a thickness of 25 μm, were coated with CVD-technique according to the following sequence: 0.7 μm TiN, 5.0 μm Ti(C,N), 6.5 μm periodic ($\alpha$-$Al_2O_3$+$ZrO_2$)*N multilayer with N=43 periods where each period was 150 nm thick and the thickness of the $\alpha$-$Al_2O_3$ layers was 85 nm and of the $ZrO_2$ layers was 65 nm. More specifically the process parameters of the periodic ($\alpha$-$Al_2O_3$+$ZrO_2$)*N multilayer is summarized in the following table:

| Gas flows (in vol-%). | ($\alpha$-$Al_2O_3$ + $ZrO_2$) * N | |
|---|---|---|
| T = 1010° C., P = 55 mbar. | $\alpha$-$Al_2O_3$ | $ZrO_2$ |
| $H_2$ | 87.5 | 87.2 |
| HCl | 5.5 | 6.5 |
| $CO_2$ | 4.4 | 5.2 |
| $H_2S$ | 0.33 | 0.39 |
| $AlCl_3$ | 2.2 | NA |
| $ZrCl_4$ | NA | 0.65 |
| Deposition Rate (μm/hrs) | 1.1 | 1.1 |

The process was such that the reactor was emptied of $AlCl_3$ before entering of $ZrCl_4$ and vice versa and therefore there was no overlap of the $AlCl_3$ and $ZrCl_4$ profiles in the transition region i.e. no mixing occurs of such chlorides.

SEM micrographs showed that the individual $Al_2O_3$ and $ZrO_2$ layers were composed of very fine grains and the transition between two different oxide layers was sharp.

It was determined by XRD that the $\alpha$-$Al_2O_3$ had no texture and that the $ZrO_2$ was a mixture of tetragonal and monoclinic phase with about 50 vol-% monoclinic phase.

The resulting multilayer had a blue color. The color coordinates of the CIE color system, the x and y values, were measured on the coated substrate using a Perkin Elmer Lambda 900 Spectrophotometer with the following settings:

| | |
|---|---|
| Integral sphere: | Covered by Spectralon material |
| Spectral resolution: | <5 nm |
| Illuminant: | D65 |
| Incidence angle (vs. normal): | 5-8 degrees |
| Detection: | Hemispherical |
| Display: | Total and diffuse reflectance |

The following coordinates of the CIE color system were obtained: x=0.266, y=0.257.

The coated inserts were post treated by blasting at 2.2 bar by using $Al_2O_3$ grits.

EXAMPLE 2

Invention

Same sample preparation as in Example 1 but with an additional top layer of 0.7 μm TiN. The coated inserts were post treated by blasting at 2.2 bar by using $Al_2O_3$ grits where the top TiN layer was removed along the edge line as well as on the whole rake face exposing the blue periodic ($\alpha$-$Al_2O_3$+$ZrO_2$)*N multilayer.

EXAMPLE 3

Invention

Cemented carbide cutting inserts of the same style and composition as in Example 1 were coated with CVD-technique according to the following sequence: 0.7 μm TiN, 5.0 μm Ti(C,N), 6.0 μm periodic ($\alpha$-$Al_2O_3$+$ZrO_2$)*N multilayer with 200 periods where each period was 30 nm thick and the thickness of the $\alpha$-$Al_2O_3$ layers was 20 nm and of the $ZrO_2$ layers was 10 nm.

More specifically the process parameters of the periodic ($\alpha$-$Al_2O_3$/$ZrO_2$)*N multilayer is summarized in the following table:

| Gas flows (in vol-%). | ($\alpha$-$Al_2O_3$ + $ZrO_2$) * N | |
| --- | --- | --- |
| T = 1010° C., P = 55 mbar. | $\alpha$-$Al_2O_3$ | $ZrO_2$ |
| $H_2$ | 87.5 | 87.2 |
| HCl | 5.5 | 6.5 |
| $CO_2$ | 4.4 | 5.2 |
| $H_2S$ | 0.33 | 0.39 |
| $AlCl_3$ | 2.2 | NA |
| $ZrCl_4$ | NA | 0.65 |
| Deposition Rate (μm/hrs) | 0.8 | 0.8 |

The process was such that in the transition, $AlCl_3$ was shunted in and $ZrCl_4$ was shunted out and vice versa and therefore there was to some extent an overlap of the $AlCl_3$ and $ZrCl_4$ profiles in the transition region i.e. mixing in the reactor.

SEM micrographs revealed that the individual $Al_2O_3$ and $ZrO_2$ layers were composed of very fine grains.

It was determined by XRD that the $\alpha$-$Al_2O_3$ had a strong (300) texture, with a TC(300) value of 4.31, and that the $ZrO_2$ was of tetragonal phase only.

The coated inserts were post treated by blasting at 2.2 bar by using $Al_2O_3$ grits.

EXAMPLE 4

Prior Art

Cemented carbide insert of the same style and composition as in Example 1 were coated with CVD-technique according to the following sequence: 0.7 μm TiN, 5.0 μm Ti(C,N), 6.5 μm $\alpha$-$Al_2O_3$. The $\alpha$-$Al_2O_3$-layer was deposited with a method that gives fine grained $\alpha$-$Al_2O_3$ according to EP-A-603144. The other layers were deposited according to prior art techniques. The coated inserts were post treated by blasting at 2.2 bar by using $Al_2O_3$ grits.

EXAMPLE 5

Inserts from Examples 1, 2 and 4 where evaluated with respect to plastic deformation in a turning operation.

| Operation: | Longitudinal turning in a bar 700 × 180 mm |
| --- | --- |
| Work piece material: | Hardened and tempered low-alloy steel, SS2541 |
| Cutting speed: | 100-180 m/min |
| Feed rate: | 0.70 mm/rev |
| Depth of cut: | 2.0 mm |
| Insert style: | CNMG 120408-PM |
| Note: | Dry machining |

Result:

| | | Edge depression (μm) at given cutting speed | | |
| --- | --- | --- | --- | --- |
| Example | Type of oxide coating | 120 (m/min) | 150 (m/min) | 180 (m/min) |
| 1 (invention) | $\alpha$-$Al_2O_3$ + $ZrO_2$ multilayer | 29 | 55 | 80 |
| 2 (invention) | $\alpha$-$Al_2O_3$ + $ZrO_2$ multilayer and TiN | 30 | 56 | 81 |
| 4 (prior art) | $\alpha$-$Al_2O_3$ | 41 | 68 | 96 |

This example shows that the multilayer coating increases the plastic deformation resistance compared to a coating according to prior art in this operation.

EXAMPLE 6

Inserts from Examples 1, 2 and 4 where evaluated with respect to plastic deformation in a turning operation.

| Operation: | Facing |
| --- | --- |
| Work piece material: | Hardened and tempered low-alloy steel, SS2541 |
| Cutting speed: | 200 m/min |
| Feed rate: | 0.35 mm/rev |
| Depth of cut: | 2.0 mm |
| Insert style: | CNMG 120408-PM |
| Note: | Dry machining |

Tool insert life criterion for this test was maximum flank wear 0.5 mm of the cutting edge.

Result:

| Example | Type of oxide coating | Number of passes |
| --- | --- | --- |
| 1 (invention) | $\alpha$-$Al_2O_3$ + $ZrO_2$ multilayer | 40 |
| 2 (invention) | $\alpha$-$Al_2O_3$ + $ZrO_2$ multilayer and TiN | 41 |
| 4 (prior art) | $\alpha$-$Al_2O_3$ | 32 |

This example shows the improved plastic deformation resistance compared to a coating according to prior art.

EXAMPLE 7

Inserts from Examples 3 and 4 where evaluated with respect to rake face flaking in a turning operation.

| Operation: | Facing |
| --- | --- |
| Work piece material: | Nodular cast iron, SS0717 |
| Cutting speed: | 160 m/min |
| Feed rate: | 0.10 mm/rev |
| Depth of cut: | 2.0 mm |
| Insert style: | CNMG 120408-PM |
| Note: | Dry machining |

The flaked area was measured as a percentage of the total area in cut where the chip is in contact with the insert.

Result:

| Example | Type of oxide coating | Amount of flaking of oxide topcoat (%) | Amount of flaking of the complete coating down to the substrate (%) |
|---|---|---|---|
| 1 (invention) | α-Al$_2$O$_3$ + ZrO$_2$ multilayer | 3 | 1 |
| 2 (invention) | α-Al$_2$O$_3$ + ZrO$_2$ multilayer and TiN | 4 | 1 |
| 3 (invention) | α-Al$_2$O$_3$ + ZrO$_2$ multilayer | 0 | 0 |
| 4 (prior art) | α-Al$_2$O$_3$ | 8 | 3 |

EXAMPLE 8

Cemented carbide cutting inserts R390-11T308M-PM (P-Milling) with the composition 12.6 wt-% Co, 1.57 wt-% cubic carbides (TaC+NbC) and balance WC were coated with CVD-technique according to the following sequence: 0.7 μm TiN, 2.8 μm Ti(C,N), 3.2 μm periodic (α-Al$_2$O$_3$+ZrO$_2$)*N multilayer with 24 periods where each period was 128 nm thick, and 0.7 μm TiN.

The α-Al$_2$O$_3$ and ZrO$_2$ layers were deposited as described in Example 1 above.

The inserts were post treated by blasting at 2.2 bar by using Al$_2$O$_3$ grits where the top TiN layer was removed along the edge line as well as on the whole rake face.

EXAMPLE 9

Reference to Example 8

Same sample preparation as in Example 8 except that, instead of the 3.2 μm periodic (α-Al$_2$O$_3$+ZrO$_2$)*N multilayer, a 3.2 μm α-Al$_2$O$_3$ was deposited.

EXAMPLE 10

Inserts from Example 8 and 9 were evaluated with respect to appearance of comb cracks in a milling operation.

| Operation: | Shoulder milling |
|---|---|
| Work piece material: | Hardened low-alloy steel, SS2244 |
| Cutting speed: | 200 m/min |
| Feed per tooth: | 0.21 mm |
| Axial Depth of cut: | 3.0 mm |
| Radial Depth of cut: | 7.0 mm |
| Cutting Diameter: | 80 mm |
| Insert style: | R390-11T308M-PM |
| Note: | wet machining |

Result:

| Example | Type of oxide coating | Number of comb cracks (average no./used edge) |
|---|---|---|
| 8 (invention) | α-Al$_2$O$_3$ + ZrO$_2$ multilayer and TiN | 0 |
| 9 (reference) | α-Al$_2$O$_3$ and TiN | 8 |

EXAMPLE 11

Invention

Cemented carbide cutting inserts CNMG 120408-PM with the composition 7.5 wt-% Co, 5.3 wt-% cubic carbides (TiC+TaC+NbC) and balance WC, having a surface zone depleted from cubic carbides of a thickness of 25 μm, were coated with CVD-technique according to the following sequence: 0.7 μm TiN, 5.0 μm Ti(C,N), 6.0 μm periodic (α-Al$_2$O$_3$+Ti$_2$O$_3$)*N multilayer with N=50 periods where each period was 120 nm thick and the thickness of the α-Al$_2$O$_3$ layers was 70 nm and of the Ti$_2$O$_3$ layers was 50 nm. More specifically the process parameters of the periodic (α-Al$_2$O$_3$+Ti$_2$O$_3$)*N multilayer is summarized in the following table:

| Gas flows (in vol-%). T = 1010° C., P = 55 mbar. | α-Al$_2$O$_3$ + Ti$_2$O$_3$) * N | |
|---|---|---|
| | α-Al$_2$O$_3$ | Ti$_2$O$_3$ |
| H$_2$ (%) | 87.5 | 88.0 |
| HCl (%) | 5.5 | 7.6 |
| CO$_2$ (%) | 4.4 | 2.0 |
| H$_2$S (%) | 0.33 | 0 |
| AlCl$_3$ (%) | 2.2 | NA |
| TiCl$_4$ (%) | NA | 2.3 |
| Deposition Rate (μm/hrs) | 1.1 | 1.5 |

The process was such that the reactor was emptied of AlCl$_3$ before entering of TiCl$_4$ and vice versa i.e. no mixing occurs of such chlorides.

SEM micrographs revealed that the transition between the two different oxide layers was sharp and that the individual Al$_2$O$_3$ and Ti$_2$O$_3$ layers were composed of very fine grains.

The resulting multilayer had a blue color. The color coordinates of the CIE color system, the x and y values, were measured on the coated substrate using a Perkin Elmer Lambda 900 Spectrophotometer with the following settings:

| Integral sphere: | Covered by Spectralon material |
|---|---|
| Spectral resolution: | <5 nm |
| Illuminant: | D65 |
| Incidence angle (vs. normal): | 5-8 degrees |
| Detection: | Hemispherical |
| Display: | Total and diffuse reflectance |

The following coordinates of the CIE color system were obtained: x=0.251, y=0.242.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. A cutting tool insert having an upper face and at least one clearance face intersecting said upper face to define cutting edges made of cemented carbide, titanium based carbonitride or ceramics, said insert being coated with a hard coating comprising a laminar, multilayered structure MX+NX+MX+NX . . . , the alternating MX and NX layers comprising metal oxides, the metal elements M and N chosen from aluminum, zirconium, titanium, hafnium and chromium wherein the repeat period of said multilayer is greater than or equal to about 20 nm but less than about 200 nm.

2. A cutting tool insert of claim 1 wherein the thickness of said MX and NX layers is from about 10 to less than about 100 nm and the total thickness of said multilayer is from about 0.1 to about 20 µm.

3. A cutting tool insert of claim 2 wherein the thickness of said MX and NX layers is from about 10 to about 90 nm and the total thickness of the multilayer is from about 0.10 to about 12 µm.

4. A cutting tool insert of claim 1 wherein said MX layers are aluminum oxide and said NX layers are zirconium oxide having an essentially tetragonal structure with less than about 10 vol-% monoclinic zirconium oxide.

5. A cutting tool insert of claim 1 wherein said MX layers are aluminum oxide and said NX layers are zirconium oxide having a mixed monoclinic and tetragonal structure with about 40 to about 60 vol-% monoclinic zirconium oxide.

6. A cutting tool insert of claim 1 wherein said MX layers are aluminum oxide and said NX layers are titanium oxide.

7. A cutting tool insert of claim 1 wherein said multilayer is deposited on a $Al_2O_3$ layer with a thickness of from about 0.5 to about 40 µm.

8. A cutting tool insert of claim 1 wherein said multilayer has a blue color described by color coordinates, in a CIE standard color chart, of: x=0.2+/−0.1; y=0.2+/−0.1.

9. A cutting tool insert of claim 1 wherein there is an outermost layer of $TiC_xN_yO_z$, where x+y+z=1, x≧0, y≧0 and z≧0, or $ZrC_xN_y$, where x+y=1, x≧0 and y≧0 on the clearance side and said multilayer is the outermost layer on the rake face.

10. A cutting tool insert of claim 9 wherein said outermost layer is of at least one of TiN, ZrN, $TiC_xN_y$, where x+y=1, x>0 and y>0, and TiC.

11. A cutting tool insert of claim 1 wherein the repeat period of the multilayer is less than about 190 nm.

12. A cutting tool insert of claim 11 wherein the repeat period of the multilayer is less than about 175 nm.

13. A cutting tool insert of claim 1, wherein if the MX layers or the NX layers comprise a zirconium oxide, the zirconium oxide has either an essentially tetragonal structure with less than about 10 vol-% monoclinic zirconium oxide or a mixed monoclinic and tetragonal structure with about 40 to about 60 vol-% monoclinic zirconium oxide.

14. A cutting tool insert of claim 1, wherein the MX and NX layers have an average grain size of from about 10 to about 150 nm.

15. A cutting tool insert of claim 2, wherein the thickness of the MX layers is greater than the thickness of the NX layers.

16. A method of making a cutting tool insert wherein said method comprises coating a substrate made of cemented carbide, titanium based carbonitride or ceramics having an upper face and at least one clearance face intersecting said upper face to define cutting edges with a hard coating comprising a laminar, multilayered structure MX+NX+MX+NX . . . , the alternating MX and NX layers comprising metal oxides, the metal elements M and N chosen from aluminum, zirconium, titanium, hafnium and chromium, the repeat period of said multilayer being greater than or equal to about 20 nm but less than about 200 nm, by CVD technique comprising holding the substrate to be coated at a temperature of from about 950 to about 1050° C. and contacting said substrate with a hydrogen carrier gas containing one or more metals halides and a hydrolyzing and/or an oxidizing agent, and keeping the oxidation potential of the CVD reactor atmosphere prior to nucleation of the metal oxides at a low level with a concentration of water vapor, $H_2O$, or other oxidizing species below about 5 ppm.

17. A method of claim 16 wherein the coating repeat period is started with nucleation of one metal oxide by sequencing of the reactant gases such that HCl and $CO_2$ are entering the reactor first in an Ar and/or $H_2$ atmosphere followed by the corresponding metal halide, where after the supply of the metal halide is stopped to ensure the reactor is empty of metal halide, repeating said sequence for the other metal oxide to yield one period of the multilayer where, in the transition of the deposition of the two metal oxides, no mixing of corresponding metal halides takes place.

18. A method of claim 17 wherein the metal halides are $AlCl_3$ and $ZrCl_4$ resulting in the alternating metal oxide layers deposited being $\alpha$-$Al_2O_3$ and $ZrO_2$, with the $ZrO_2$ having a mixed tetragonal and monoclinic structure.

19. A method of claim 16 wherein throughout the coating repeat period the reactor contains an Ar and/or $H_2$ atmosphere with reactant gases HCl, $CO_2$ and a sulphur catalyst being present and alternately adding the two different metal halides into the reactor, allowing nucleation and growth of corresponding metal oxide layer where, in at least the transition of the deposition of the two different metal oxides, mixing of the corresponding metal halides takes place.

20. A method of claim 19 wherein the metal halides are $AlCl_3$ and $ZrCl_4$ resulting in the alternating metal oxide layers deposited being $\alpha$-$Al_2O_3$ and $ZrO_2$, with the $ZrO_2$ having an essentially tetragonal structure.

* * * * *